United States Patent
Al-Rawhani et al.

(10) Patent No.: US 12,490,532 B2
(45) Date of Patent: Dec. 2, 2025

(54) ACTIVE RECHARGE QUENCHING CIRCUIT FOR NEGATIVE BIAS SPAD

(71) Applicant: STMicroelectronics (Research & Development) Limited, Marlow (GB)

(72) Inventors: Mohammed Al-Rawhani, Glasgow (GB); Bruce Rae, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 549 days.

(21) Appl. No.: 17/975,178

(22) Filed: Oct. 27, 2022

(65) Prior Publication Data

US 2024/0145503 A1  May 2, 2024

(51) Int. Cl.
  *H10F 39/00* (2025.01)
  *H10F 30/225* (2025.01)
  *H10F 39/18* (2025.01)

(52) U.S. Cl.
  CPC ..... *H10F 39/80377* (2025.01); *H10F 30/225* (2025.01); *H10F 39/18* (2025.01)

(58) Field of Classification Search
  CPC ... H10F 39/18; H10F 39/80377; H10F 30/225
  See application file for complete search history.

(56) References Cited

U.S. PATENT DOCUMENTS

| | | | |
|---|---|---|---|
| 8,637,875 B2 | 1/2014 | Finkelstein et al. | |
| 9,178,100 B2 | 11/2015 | Webster et al. | |
| 9,671,284 B1 * | 6/2017 | Dandin | H03K 5/1534 |
| 10,852,399 B2 * | 12/2020 | Fenigstein | H10F 77/959 |
| 11,039,515 B2 | 6/2021 | Roehrer et al. | |
| 2014/0191115 A1 | 7/2014 | Webster et al. | |

(Continued)

FOREIGN PATENT DOCUMENTS

| CN | 114624678 A | 6/2022 |
|---|---|---|
| EP | 3913338 A1 | 11/2021 |
| WO | 2016003451 A1 | 1/2016 |

OTHER PUBLICATIONS

Chen, Ming, et al: "Design and Implementation of a Compact Single-Photon Counting Module," Electronics, 2020, 1131, doi:10.3390/electronics9071131, 11 pgs.

(Continued)

*Primary Examiner* — Kevin K Pyo
(74) *Attorney, Agent, or Firm* — Crowe & Dunlevy LLC

(57) ABSTRACT

Disclosed herein is a single photon avalanche diode (SPAD) pixel for use in time-of-flight imaging. This pixel includes a SPAD having a cathode connected to a first node and an anode coupled to first negative voltage. A transistor circuit in the pixel includes a quench transistor connected between a supply voltage node and a second node, the quench transistor controlled by a quench control signal to operate in a high-impedance mode, and a recharge transistor connected in parallel with the quench transistor between the supply voltage node and the second node, the recharge transistor controlled by a feedback signal. The pixel also includes a readout inverter generating an output signal based upon a voltage at the first node and an adjustable delay circuit generating the feedback signal based upon the output signal, the feedback signal being delayed with respect to the output signal.

14 Claims, 5 Drawing Sheets

(56) References Cited

U.S. PATENT DOCUMENTS

2015/0364635 A1  12/2015  Bodlovic et al.
2021/0181017 A1  6/2021   Al-Rawhani et al.

OTHER PUBLICATIONS

EP Search Report and Written Opinion for counterpart EP Appl. No. 23203717.6, report dated Feb. 2, 2024, 11 pgs.
EP First Office Action for counterpart EP Appl. No. 23203717.6, report dated May 7, 2025, 7 pgs.

* cited by examiner

ACTIVE RECHARGE QUENCHING CIRCUIT FOR NEGATIVE BIAS SPAD

TECHNICAL FIELD

This disclosure is related to the field of photodetection pixels and, in particular, to a photodetection pixel with active recharge yet that is compact in terms of area.

BACKGROUND

Single photon avalanche diode (SPAD) photodetectors are based on a PN junction that is reverse biased at a voltage exceeding a breakdown voltage. When a photon-generated carrier (via the internal photoelectric effect) is injected into the depletion region of the PN junction, a self-sustaining avalanche ensues, and detection of current output as a result of this avalanche can be used to indicate detection of the photon that generated the carrier. This avalanche is stopped by lowering the reverse bias across the SPAD for a short time interval, and it is this time interval that determines the dead time (e.g., the period of time after the detection of a photon where no further detection is possible).

A sample prior art pixel 1 for use in a photodetector is shown in FIG. 1A. The pixel 1 includes a SPAD 2 having its cathode coupled to a high voltage supply (VHV=VEX+VBD) and its anode coupled to ground through the source of an n-channel quench transistor MN. The gate of the quench transistor MN is coupled to receive a quench control signal Vq.

When the quench control signal Vq is set sufficiently high such that the quench transistor MN turns on in the linear region of operation to act as a resistor, the anode of the SPAD 2 is connected to ground through the source-drain resistance of the quench transistor MN, setting the reverse bias voltage of the SPAD 2 above its breakdown voltage.

When an incoming photon strikes the SPAD 2, the SPAD 2 will avalanche and the voltage at its anode will swing between the voltage VEX and ground, creating a current pulse that is detected by the inverter 3. The avalanche is quenched by the source-drain resistance of the quench transistor MN. This resets the SPAD 3 for the next detection, with the duration of this reset period setting the dead time.

The dead time in turn limits the maximum count rate to $1/_{eT}$, with T being the dead time and e being Euler's constant representing the RC time constant. The maximum count rate (MCR) of a sample SPAD is shown in FIG. 1B, where it can be observed that count rate of the SPAD increases with illumination intensity until it reaches a peak at the MCR, after which time the count rate decays as the SPAD saturates.

FIG. 1C shows how in the photodetector of FIG. 1A, in lower light conditions, the SPAD 2 does not saturate, with individual output pulses OUT being generated at the output of the inverter 3 as the anode voltage of the SPAD 2 rises above the threshold voltage Vth of the inverter 3 during a detection event and falls back below the threshold voltage Vth of the inverter 3 during quenching. Consider now, however, the higher light conditions in FIG. 1D in which the SPAD 2 saturates, preventing the anode voltage of the SPAD 2 from falling back below the threshold voltage of the inverter 3 during quenching, therefore causing the missing of individual photo detection events.

This is clearly undesirable, as there are instances in high light condition environments where the capability of handling a high count rate is desired. One known solution to permit the handling of a high count rate in a high light environment is to use an active reset whereby the SPAD is forced to reset quickly, reducing deadtime.

A sample prior art pixel 1' utilizing an active reset (active quenching) is shown in FIG. 2A. This pixel 1' is similar to the pixel 1, except the output OUT of the inverter 3 is passed through an additional inverter 4 and then delayed by a delay circuit 5 and used in feedback to drive the gate of the quench transistor MN. In operation, the quench transistor MN is maintained in linear mode, acting as a quench resistance. When a photon strikes the SPAD 2, the delay introduced by the inverters 3, 4 and the delay circuit 5 permits the SPAD 2 to complete its quenching phase before the rising anode voltage turns the quench transistor MN fully on into saturation, substantially lowering its impedance such that the SPAD 2 is quickly reset to have its reverse bias voltage be above its breakdown voltage. The effects of this can be observed in the graphs of FIGS. 2B and 2C, showing that in both low-light and high-light conditions, the anode voltage of the SPAD 2 falls back below the threshold voltage of the inverter 3 prior to the next detection event due to the active quenching. The ability to avoid saturation of the SPAD 2 in high light conditions results in the count rate of the SPAD maintaining steady at its maximum even at high light conditions, as shown in FIG. 2D.

While this pixel 1' corrects the issues with the pixel 1 of FIG. 1A resulting from saturation of the SPAD 2, issues are still present. For example, active reset utilizes complex circuits based upon positive feedback which can lead to instability, which consume a large amount of area, and which may limit quantum efficiency. (See, for example, the solution in Dolatpoor, et al., "An Ultrafast Active Quenching Active Reset Circuit with 50% SPAD Afterpulsing Reduction in a 28 nm FD-SOI CMOS Technology Using Body Biasing Technique. Sensors (Basel)," 2021 Jun 10; 21(12): 4014. doi: 10.3390/s21124014. PMID: 34200801; PMCID: PMC8230464—incorporated herein by reference).

Due to these drawbacks of the current approaches, it is evident that further development is needed.

SUMMARY

Disclosed herein is an array of single photon avalanche diodes (SPADs), including a plurality of pixels. Each pixel includes: a SPAD having a cathode connected to a first node and an anode coupled to first negative voltage; and a transistor circuit.

The transistor circuit includes: a quench transistor connected between a supply voltage node and a second node, the quench transistor controlled by a quench control signal to operate in a high-impedance mode; a recharge transistor connected in parallel with the quench transistor between the supply voltage node and the second node, the recharge transistor controlled by a feedback signal; a readout inverter configured to generate an output signal based upon a voltage at the first node; and an adjustable delay circuit configured to generate the feedback signal based upon the output signal, the feedback signal being delayed with respect to the output signal.

Avalanche of the SPAD based upon a strike by an incoming photon may result in a voltage drop at the first node, causing the readout inverter to assert the output signal, in turn causing the adjustable delay circuit to assert the feedback signal after the delay to thereby turn the recharge transistor on into a low-impedance mode until a voltage at an input of the readout inverter rises above a threshold voltage of the readout inverter to recharge the SPAD. The delay may be such that the feedback signal turns on the recharge transistor after full quenching of the SPAD.

The adjustable delay circuit may include: a starved inverter having an input receiving the output signal and having an output connected to the feedback node; and a capacitor connected between the feedback node and ground; wherein the delay is a function of a transition time of the starved inverter and a capacitance of the capacitor.

The starved inverter may be an inverter having a first power terminal connected to the supply voltage node and a second power terminal connected through a starvation transistor to ground, with a conductivity of the starvation transistor being set by a control voltage supplied to a control terminal of the starvation transistor.

The starvation transistor may be an n-channel transistor having a drain connected to the second power terminal of the starved inverter, a source connected to ground, and a gate connected to the control voltage.

The transistor circuit may also include: an enable transistor connected between the second node and a first intermediate node, the enable transistor controlled by an enable signal; and a cascode transistor connected between the first intermediate node and the first node, the cascode transistor controlled by a cascode control signal. The readout inverter may be connected between the first intermediate node and a second intermediate node, the readout inverter configured to generate the output signal in response to a voltage at the first intermediate node. The adjustable delay circuit may be connected between the second intermediate node and the feedback node, the adjustable delay circuit configured to generate the feedback signal based upon the output signal, the feedback signal being delayed with respect to the output signal.

The cascode transistor may be an extended drain p-channel transistor having its source connected to the first intermediate node, its drain connected to the first node, and its gate controlled by the cascode control signal.

The enable transistor may be a thin or double layer gate oxide p-charnel transistor having its source connected to the second node, its drain connected to the first intermediate node, and its gate controlled by the enable signal.

The quench transistor may be a first p-channel transistor having its source connected to the supply voltage node, its drain connected to the first node, and its gate controlled by the quench control signal.

The recharge transistor may be a second p-channel transistor having its source connected to the supply voltage node, its drain connected to the first node, and its gate controlled by the feedback signal, the second p-channel transistor being a thin gate oxide p-channel transistor.

A turn-off diode may have its anode connected to a second negative voltage lower than the first negative voltage and its cathode connected to the first node.

The transistor circuit, readout inverter, and adjustable delay circuit may be integrated within a first tier chip. The SPAD may be integrated within a second tier chip, and the first tier chip and second tier chip are in a stacked die arrangement.

The anode of the SPAD may be coupled to the first negative voltage through a deep trench isolation parasitic capacitance.

Also disclosed herein is a method of detecting photons impinging upon a single photon avalanche diode (SPAD) within a pixel. The method includes: receiving a photon at the SPAD to thereby cause the SPAD to avalanche; asserting an output signal in response to the avalanche; quenching the avalanche through a high-impedance path connected between a cathode of the SPAD and a supply voltage node; asserting a feedback signal in response to the output signal, the feedback signal being delayed with respect to the output signal; and in response to assertion of the feedback signal, recharging the SPAD through a low-impedance path connected in parallel with the high-impedance path.

The assertion of the output signal may be performed by asserting output of a readout inverter in response to the avalanche.

The assertion of the feedback signal may be performed by inverting the output signal by using a starved inverter to sink current from a feedback node at which the feedback signal is produced, the sinking of the current from the feedback node including discharging of a capacitor connected between the feedback node and ground.

The quenching of the avalanche through the high-impedance path may be performed by: setting a quench transistor connected between the supply voltage node and a second node to operate in linear mode; enabling an enable transistor connected between the second node and a first intermediate node; and operating a transistor connected between the first intermediate node and a first node in as a cascode, wherein the SPAD is connected between the first node and ground.

The recharging of the SPAD through the low-impedance path may be performed by turning a recharge transistor connected between the supply voltage node and the second node to operate in a low-impedance saturation mode, in response to the assertion of the feedback signal.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. Do note that in the below description, any described resistor or resistance is a discrete device unless the contrary is stated, and is not simply an electrical lead between two points. Thus, any described resistor or resistance coupled between two points has a greater resistance than a lead between those two points would have, and such resistor or resistance cannot be interpreted to be a lead. Similarly, any described capacitor or capacitance is a discrete device unless the contrary is stated, and is not a parasitic unless the contrary is stated. Moreover, any described inductor or inductance is a discrete device unless the contrary is stated, and is not a parasitic unless the contrary is stated.

Figure 1A:
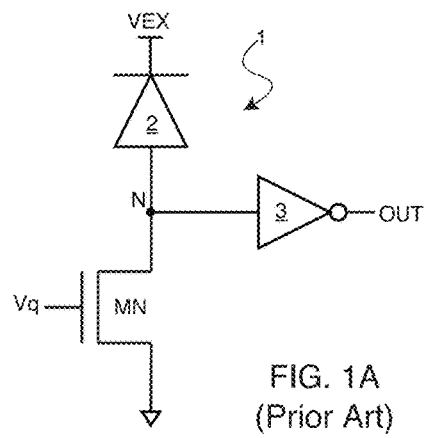
FIG. 1A is a schematic diagram of a known SPAD-based detection pixel.
Figure 1B:
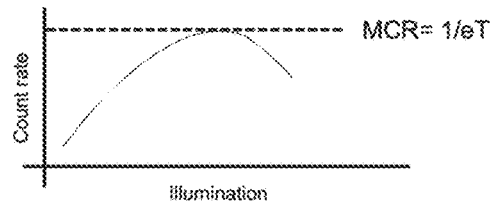
FIG. 1B is a graph showing the relationship between illumination and count rate output by the SPAD of FIG. 1A.
Figure 1C:
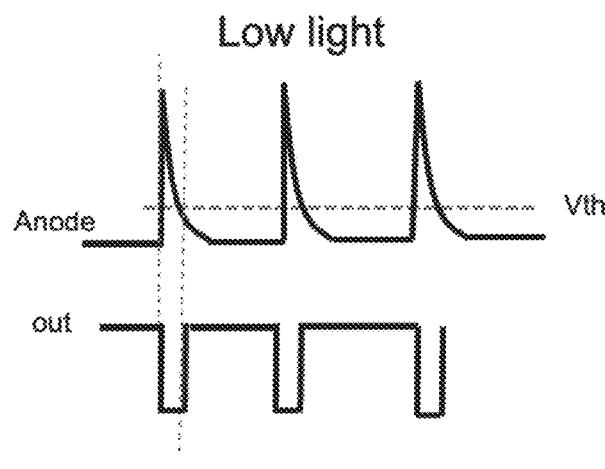
FIG. 1C is a graph showing the anode voltage of the pixel of FIG. 1A during operation in low light conditions.
Figure 1D:
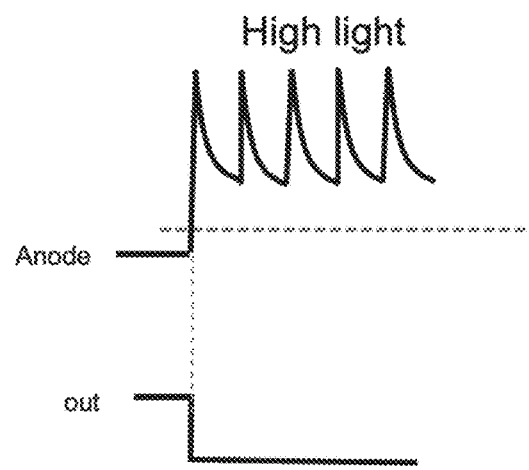
FIG. 1D is a graph showing the anode voltage of the pixel of FIG. 1A during operation in high light conditions.
Figure 2A:
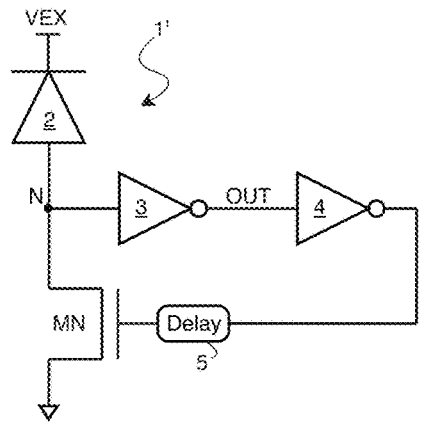
FIG. 2A is a schematic diagram of a known SPAD-based detection pixel utilizing active reset.
Figure 2B:
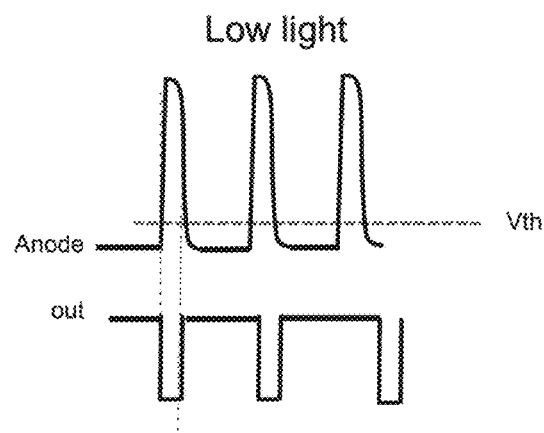
FIG. 2B is a graph showing the anode voltage of the pixel of FIG. 2A during operation in low light conditions.
Figure 2C:
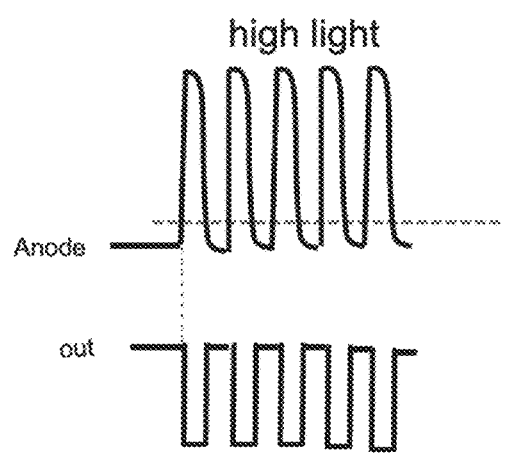
FIG. 2C is a graph showing the anode voltage of the pixel of FIG. 2A during operation in high light conditions.
Figure 2D:
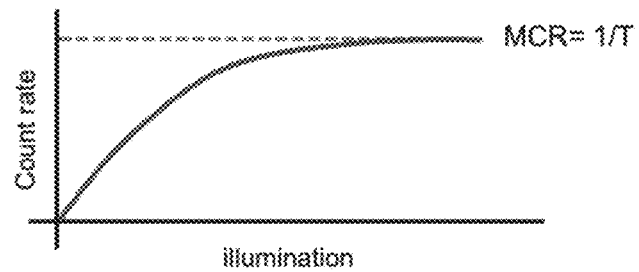
FIG. 2D is a graph showing the relationship between illumination and count rate output by the SPAD of FIG. 2A.
Figure 3:
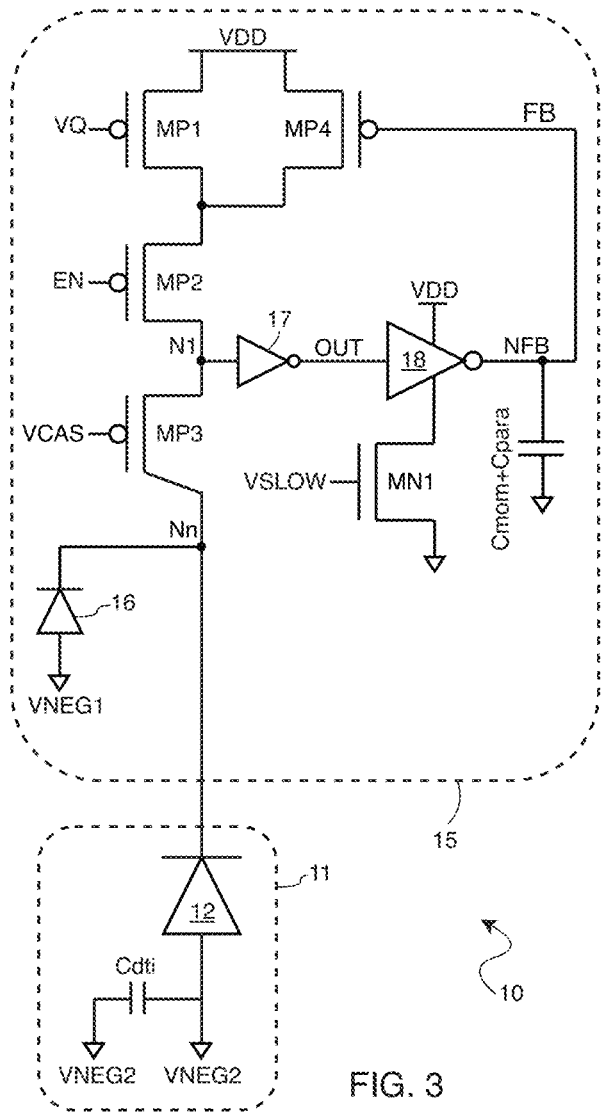
FIG. 3 is a schematic diagram of a SPAD-based detection pixel disclosed herein utilizing active reset.

A SPAD pixel 10 is now described with reference to FIG. 3. This pixel 10 is usable in any device utilizing time-of-flight sensing, and may be used in multi-zone ranging as well as true-depth ranging (e.g., high resolution for applications such as facial recognition, room mapping, and augmented reality/virtual reality applications). The SPAD pixel 10 is formed in a stacked die solution where a bottom tier chip includes the circuitry in box 11 and a top tier chip includes the circuitry in box 15.

The bottom tier chip (box 11) includes a SPAD 12 (e.g., fully depleted) having its cathode connected to node Nn and its anode connected to a negative voltage VNEG2 through a deep trench isolation parasitic capacitance Cdti that results from the fact that the SPAD 12 is formed using three dimensional SPAD technology in which different SPADs are separated from one another by deep trench isolations. The negative voltage VNEG2 may be, for example, −24V. The fact that the top tier chip 11 does not include other components other than the SPADs decreases the cost of fabrication, and increases fill factor and quantum efficiency.

The top tier chip (box 15) includes a double layer gate oxide (GO2) p-channel transistor MP1 having its source connected to a supply node to receive a supply voltage VDD (e.g., 1V), its gate connected to a quench control voltage VQ, and its drain connected to the source of thin gate oxide or double layer (GO1/GO2) p-channel transistor MP2. The quench control voltage VC) is set so as to maintain the transistor MP1 in the linear mode of operation and therefore act as a resistor of a desired value.

A GO1 p-channel transistor MP4 has its source connected to the voltage VDD, its gate connected to a feedback signal FB, and its drain connected to the drain of p-channel transistor MP1 and the source of p-channel transistor MP2. The p-channel transistor MP2 has its drain connected to the source of extended drain p-channel transistor MP3 at node N1 and its gate connected to an enable signal EN. The p-channel transistor MP3 has its source connected to node N1, its drain connected to node Nn and its gate connected to a cascode control signal VCAS. Since node Nn represents the electrical connection between bottom tier chip (box 11) and top tier chip (box 15), node Nn represents a hybrid bond—a pixel level wafer to wafer electrical connection.

The top tier chip (box 15) further includes a clamp diode 16 having its cathode connected to node Nn and its anode connected to the negative voltage VNEG1, the negative voltage VNEG1 being, for example, −4V. The diode 16 serves to clamp the voltage at node Nil such that during operation, the voltage at node N1 remains within the safe operating range of MP3.

An inverter 17 has its input connected to node N1 and generates an output signal OUT at its output. A starved inverter 18 receives the output signal OUT at its input and has its output connected to a feedback node NEB; the starved inverter 18 is powered between the voltage VDD and the drain voltage of an n-channel transistor MN1. In particular, the first power terminal of the starved inverter 18 is connected to the voltage VDD and the second power terminal of the starved inverter 18 is connected to the drain of n-channel transistor MN1. The n-channel transistor MN1 also has its source connected to ground and its gate receiving a voltage VSLOW that sets the transistor MN1 to operate in linear mode and act as a resistor. It is the n-channel transistor MN1 that serves to "starve" the inverter 18 by providing a virtual ground above system ground, resulting in the inverter 18 switching states slowly.

A metal-oxide-metal (MOM) capacitor Cmom is connected between node NFB and ground. The feedback voltage FB is formed across capacitor Cmom at node NFB.

Figure 4:
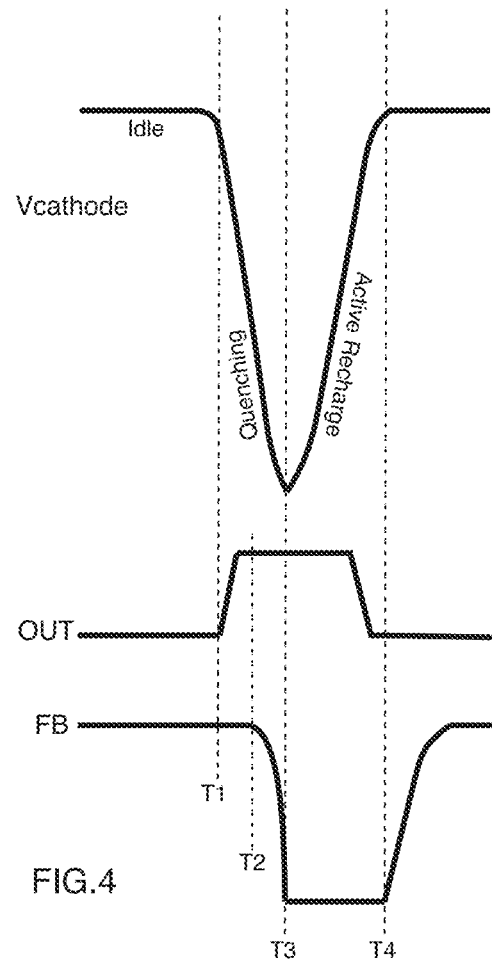
FIG. 4 is a graph showing the values of the cathode voltage, output voltage, and feedback voltage of the pixel of FIG. 3 during a detection event.

In operation, when an incoming photon strikes the SPAD 12, an avalanche will trigger, and its cathode voltage will sharply drop from an idle voltage (used to maintain the SPAD 12 in a reverse bias condition) to a lower voltage. This can be observed at time T1 (the time of the photon strike) in the graph of FIG. 4 showing the cathode voltage of the SPAD 10, the voltage of the output signal OUT, and the voltage of the feedback signal FB. This drop in voltage will result from the rush of current from the supply node VDD through the transistors MP1, MP2, MP3, keeping in mind the biasing of transistor MP1 by the quench control signal VQ and the biasing of transistor MP3 by the cascode control signal VCAS results in a resistance between VDD and node Nn. The rush of current between VDD and node Nn creates the voltage swing appearing at the cathode voltage of the SPAD 10 at time T1. As a result of this voltage drop at the input of the inverter 17, the output signal OUT at the output of the inverter 17 rises, as also seen at time T1.

The rise of the output signal OUT at the input of the starved inverter 18 in turn causes the fall of the feedback voltage FB at the output of the starved inverter 18 starting at time T2 and ending at time T3. As understood by those of skill in the art, the starved inverter 18 operates to pull the feedback voltage FB to ground in response to the rise of the output signal OUT by sinking current from its output. The capacitor Cmom will be charged from the previous state of the inverter 18 (e.g., the output of the inverter 18 being at a logic high prior to time T1), and this capacitance, as well as an associated parasitic capacitance Cpara, are discharged to ground by the operation of the inverter 18 starting at time T2.

Due to the starvation of the inverter 18, and due to the capacitor Cmom having charge stored thereon due to the output of the starved inverter 18 prior to the rise of the output signal OUT that will in turn be discharged to ground by the inverter 18 during the detection event, the fall of the feedback voltage FB at the output of the inverter 18 is delayed from the time at which the output signal OUT is received as a logic high at the input of the inverter 18—stated another way, the time interval between time T2 (beginning of triggering of the inverter 18 with a logic high input) and T3 (completion by inverter 18 of pulling the feedback voltage FB at its output to a logic low) is artificially increased due to the starvation of the inverter 18 and the need to discharge the charge stored across the capacitor Cmom.

Once the feedback voltage FB reaches a logic low, transistor MP4 is fully turned on in saturation. Since transistors MP1 and MP4 are connected in parallel, at this point when transistor MP4 is fully turned on in saturation (low-impedance) but transistor MP1 is a GO2 transistor biased at a mid-rail voltage into a high-impedance mode, transistor MP4 will effectively act as a short across transistor MP1, allowing drawing of a higher current from supply node VDD to recharge the cathode voltage of the SPAD 10 to the idle value faster than would otherwise be possible with transistor MP1 biased as is. This is therefore a fast active recharge performed between times T3 (feedback voltage FB reaching logic low to turn on transistor MP4) and T4 (completion of active recharge). After active recharge is complete, the cathode voltage of the SPAD 10 is therefore again the idle voltage, with the result being that the output signal OUT is pulled back to a logic low, and in turn the feedback signal FB is driven back to a logic high.

This operation of the high-impedance path through transistor MP1 being utilized during quenching and the low-impedance path through transistor MP4 being utilized during recharge permits the cathode voltage of the SPAD 10 to rise back above the threshold voltage of the inverter 17 during quenching while providing for a quick active recharge, thereby avoiding saturation of the SPAD 12 in high-light situations.

The specific delay imposed on the fall of the feedback signal FB following a photon strike of the SPAD 10 is a function of the capacitance of the capacitor Cmom and the voltage VSLOW used to bias transistor MN1. The higher the capacitance of CMOM, the greater the delay; the lower the voltage of VSLOW, the greater the delay. Conversely, the lower the capacitance of CMOM, the lower the delay; the higher the voltage of VSLOW, the lower the delay. Through selection of the values of CMOM and VSLOW (by circuit design and/or tuning), the delay can be precisely set to enable proper quench and recharge for a given SPAD within a wide range of statistical quenching time variations between different avalanches.

Figure 5:
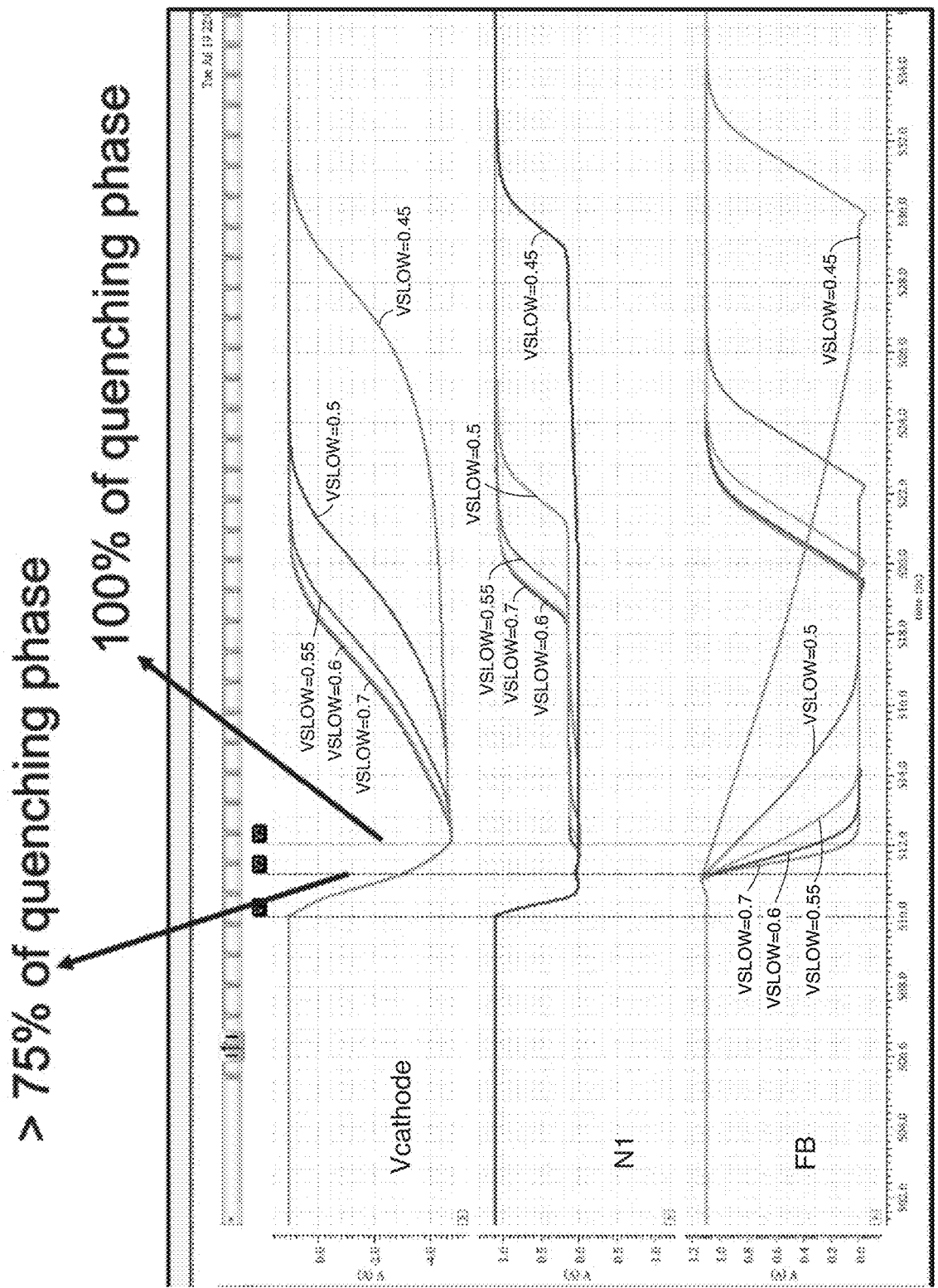
FIG. 5 is a graph showing the values of the cathode voltage, intermediate node voltage, and feedback voltage of the pixel of FIG. 3 during a detection event.

The effect of changing the values of VSLOW can be observed in FIG. 5, showing the values of the cathode voltage of the SPAD 10, the voltage at node N1, and the output voltage FB. Observe that as the voltage VSLOW decreases, the time to recharge the SPAD 10 increases, the time for the voltage at node N1 to return to a logic high increases, and the time for the feedback voltage FB to return to a logic high increases.

This pixel design provides for the possibility of using a higher supply voltage VDD than may be used in prior art designs. In addition, the maximum count rate in high light conditions is substantially higher than in prior art passive recharge designs due to the active recharge. Still further, as compared to other active recharge designs, this design is compact and simple, with a low charge per pulse.

Figure 6:
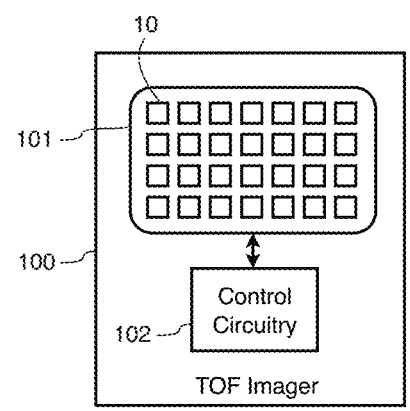
FIG. 6 is a block diagram of a time-of-flight imaging device including an array of the SPAD-based detection pixels of FIG. 2A.

This pixel design may be used to form an array 101 of the SPAD pixels 10 described above and this array 101 may be utilized within a time-of-flight imaging device 100, as shown in FIG. 6. The time-of-flight imaging device 100 includes control circuitry 102 cooperating and interfacing with the array 101 to perform time-of-flight imaging.

It is clear that modifications and variations may be made to what has been described and illustrated herein, without thereby departing from the scope of this disclosure, as defined in the annexed claims.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An array of single photon avalanche diodes (SPADs), comprising:
    a plurality of pixels, each pixel comprising:
        a SPAD having a cathode connected to a first node and an anode coupled to first negative voltage;
        a transistor circuit comprising:
            a quench transistor connected between a supply voltage node and a second node, the quench transistor controlled by a quench control signal to operate in a high-impedance mode;
            a recharge transistor connected in parallel with the quench transistor between the supply voltage node and the second node, the recharge transistor controlled by a feedback signal;
            a readout inverter configured to generate an output signal based upon a voltage at the first node; and
            an adjustable delay circuit configured to generate the feedback signal based upon the output signal, the feedback signal being delayed with respect to the output signal;
    wherein the adjustable delay circuit comprises:
        an inverter having an input receiving the output signal, an output connected to the feedback node, a first power terminal connected to the supply voltage node, and a second power terminal connected through a transistor to ground, with a conductivity of the transistor being set by a control voltage supplied to a control terminal of the transistor; and
        a capacitor connected between the feedback node and ground;
    wherein the delay is a function of a transition time of the inverter and a capacitance of the capacitor.

2. The array of SPADs of claim 1, wherein avalanche of the SPAD based upon a strike by an incoming photon results in a voltage drop at the first node, causing the readout inverter to assert the output signal, in turn causing the adjustable delay circuit to assert the feedback signal after the delay to thereby turn the recharge transistor on into a low-impedance mode until a voltage at an input of the readout inverter rises above a threshold voltage of the readout inverter to recharge the SPAD; and wherein the delay is such that the feedback signal turns on the recharge transistor after full quenching of the SPAD.

3. The array of SPADS of claim 2, wherein the starvation transistor comprises an n-channel transistor having a drain connected to the second power terminal of the starved inverter, a source connected to ground, and a gate connected to the control voltage.

4. The array of SPADs of claim 1,
wherein the transistor circuit further comprises:
an enable transistor connected between the second node and a first intermediate node, the enable transistor controlled by an enable signal; and
a cascode transistor connected between the first intermediate node and the first node, the cascode transistor controlled by a cascode control signal;
wherein the readout inverter is connected between the first intermediate node and a second intermediate node, the readout inverter configured to generate the output signal in response to a voltage at the first intermediate node; and
wherein the adjustable delay circuit is connected between the second intermediate node and the feedback node, the adjustable delay circuit configured to generate the feedback signal based upon the output signal.

5. The array of SPADs of claim 4, wherein the cascode transistor is an extended drain p-channel transistor having its source connected to the first intermediate node, its drain connected to the first node, and its gate controlled by the cascode control signal.

6. The array of SPADs of claim 4, wherein the enable transistor comprises a thin or double layer gate oxide p-channel transistor having its source connected to the second node, its drain connected to the first intermediate node, and its gate controlled by the enable signal.

7. The array of SPADs of claim 1, wherein the quench transistor is a first p-channel transistor having its source connected to the supply voltage node, its drain connected to the second node, and its gate controlled by the quench control signal.

8. The array of SPADs of claim 7, wherein the recharge transistor is a second p-channel transistor having its source connected to the supply voltage node, its drain connected to the second node, and its gate controlled by the feedback signal, the second p-channel transistor being a thin gate oxide p-channel transistor.

9. The array of SPADs of claim 1, further comprising a turn-off diode having its anode connected to a second negative voltage lower than the first negative voltage and its cathode connected to the first node.

10. The array of SPADs of claim 1, wherein the transistor circuit, readout inverter, and adjustable delay circuit are integrated within a first tier chip; wherein the SPAD is integrated within a second tier chip; and wherein the first tier chip and second tier chip are in a stacked die arrangement.

11. The array of SPADs of claim 1, wherein the anode of the SPAD is coupled to the first negative voltage through a deep trench isolation parasitic capacitance.

12. A method of detecting photons impinging upon a single photon avalanche diode (SPAD) within a pixel, the method comprising:
receiving a photon at the SPAD to thereby cause the SPAD to avalanche;
asserting an output signal in response to the avalanche;
quenching the avalanche through a high-impedance path connected between a cathode of the SPAD and a supply voltage node;
asserting a feedback signal in response to the output signal, the feedback signal being delayed with respect to the output signal, the assertion of the feedback signal being performed by asserting output of a readout inverter in response to the avalanche, the assertion of the feedback signal being performed by: inverting the output signal by using a starved inverter to sink current from a feedback node at which the feedback signal is produced, the sinking of the current from the feedback node including discharging of a capacitor connected between the feedback node and ground; and
in response to assertion of the feedback signal, recharging the SPAD through a low-impedance path connected in parallel with the high-impedance path.

13. The method of claim 12, wherein the quenching of the avalanche through the high-impedance path is performed by:
setting a quench transistor connected between the supply voltage node and a second node to operate in linear mode;
enabling an enable transistor connected between the second node and a first intermediate node; and
operating a transistor connected between the first intermediate node and a first node in as a cascode, wherein the SPAD is connected between the first node and ground.

14. The method of claim 13, wherein the recharging of the SPAD through the low-impedance path is performed by:
turning a recharge transistor connected between the supply voltage node and the second node to operate in a low-impedance saturation mode, in response to the assertion of the feedback signal.

\* \* \* \* \*